(12) United States Patent
Vdovin et al.

(10) Patent No.: US 10,168,008 B2
(45) Date of Patent: Jan. 1, 2019

(54) COLOR POINT VARIABLE LIGHT EMITTING APPARATUS

(71) Applicant: KONINKLIJKE PHILIPS N.V., Eindhoven (NL)

(72) Inventors: Olexandr Valentynovych Vdovin, Aachen (DE); Rifat Ata Mustafa Hikmet, Aachen (DE); Petrus Theodorus Jutte, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/555,539

(22) PCT Filed: Mar. 1, 2016

(86) PCT No.: PCT/EP2016/054301
§ 371 (c)(1),
(2) Date: Sep. 4, 2017

(87) PCT Pub. No.: WO2016/142212
PCT Pub. Date: Sep. 15, 2016

(65) Prior Publication Data
US 2018/0066809 A1 Mar. 8, 2018

(30) Foreign Application Priority Data
Mar. 9, 2015 (EP) ..................... 15158191

(51) Int. Cl.
*F21V 11/08* (2006.01)
*F21V 23/04* (2006.01)
(Continued)

(52) U.S. Cl.
CPC ................. *F21K 9/64* (2016.08); *F21V 9/30* (2018.02); *F21V 11/00* (2013.01); *F21V 14/003* (2013.01);
(Continued)

(58) Field of Classification Search
CPC ..... F21V 9/30; F21V 9/32; F21K 9/64; H01L 33/50–33/508; H01L 2933/0041
See application file for complete search history.

(56) References Cited

U.S. PATENT DOCUMENTS

2009/0002976 A1* 1/2009 Schulz ...................... G02F 1/25
362/84
2009/0026908 A1* 1/2009 Bechtel .............. C09K 11/7774
313/110
(Continued)

FOREIGN PATENT DOCUMENTS

| WO | 2007069142 A2 | 6/2007 |
| WO | 2013118037 A1 | 8/2013 |
| WO | 2014030149 A2 | 2/2014 |

OTHER PUBLICATIONS

EPO as ISA, "International Search Report and Written Opinion" dated May 2, 2016 from International Application No. PCT/EP2016/054301, filed Mar. 1, 2016, 12 pages.
(Continued)

*Primary Examiner* — Suezu Ellis
(74) *Attorney, Agent, or Firm* — Brian D. Ogonowsky; Patent Law Group LLP

(57) ABSTRACT

A color point variable light emitting apparatus is provided. The color point variable apparatus comprises a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength, a light source having a controllable optical element, the light source is arranged to, with light of a first wavelength, illuminate both a portion of the wavelength converting element and a portion of the non-wavelength converting element, and a
(Continued)

controller arranged to control the controllable optical element such that a ratio of the portion of the wavelength converting element and the portion of the non-wavelength converting element illuminated by the light source is changed. A method for varying color point of light is further provided.

14 Claims, 3 Drawing Sheets

(51) Int. Cl.
| | |
|---|---|
| *F21V 14/00* | (2018.01) |
| *F21V 9/30* | (2018.01) |
| *F21V 7/22* | (2018.01) |
| *F21K 9/64* | (2016.01) |
| *H01L 33/50* | (2010.01) |
| *F21V 11/00* | (2015.01) |
| *F21V 14/08* | (2006.01) |
| *F21Y 115/30* | (2016.01) |
| *F21Y 115/10* | (2016.01) |

(52) U.S. Cl.
CPC ............ *F21V 14/08* (2013.01); *H01L 33/502* (2013.01); *F21V 7/22* (2013.01); *F21V 11/08* (2013.01); *F21V 23/0457* (2013.01); *F21Y 2115/10* (2016.08); *F21Y 2115/30* (2016.08)

(56) References Cited

U.S. PATENT DOCUMENTS

| | | |
|---|---|---|
| 2010/0301360 A1 | 12/2010 | Van de Ven et al. |
| 2013/0264947 A1* | 10/2013 | Ouderkirk ........... H01L 25/0753 |
| | | 315/151 |
| 2014/0063779 A1 | 3/2014 | Bradford |
| 2015/0062907 A1 | 3/2015 | Ng et al. |

OTHER PUBLICATIONS

Extended European Search Report dated Sep. 2, 2015 from European Patent Application No. 15158191.5 filed Feb. 1, 2016, 7 pages.

* cited by examiner

COLOR POINT VARIABLE LIGHT EMITTING APPARATUS

CROSS-REFERENCE TO RELATED APPLICATIONS

The present application is a § 371 application of International Application No. PCT/EP2016/054301 filed on Mar. 1, 2016 and titled "A COLOR POINT VARIABLE LIGHT EMITTING APPARATUS," which claims the benefit of European Patent Application No. 15158191.5 filed on Mar. 9, 2015. International Application No. PCT/EP2016/054301 and European Patent Application No. 15158191.5 are incorporated herein.

FIELD OF THE INVENTION

The invention relates to a color point variable light emitting apparatus and a method for varying color point of light.

BACKGROUND OF THE INVENTION

A modern energy-efficient light source module emitting white light is often based on a light emitting diode, LED, providing light in the blue spectral range and a wavelength converting element arranged to convert at least a part of the blue light into a green-yellow spectral range. The color point of the white light provided by such a light source module is determined by the ratio of the two spectral contributions, i.e. the blue and the yellow-green light. The color point of the light source module may be set to a given value by, for instance, the power of the blue light, the thickness, material and/or the structure of the wavelength converting element. Hence, it is possible to tailor the amount of light that is converted by the interaction with the wavelength converting element. Alternatively, additional optical components such as back-reflecting mirrors may be used to change the ratio of the two spectral contributions, i.e. the blue and the yellow-green light. To control the color point of the light emitted from the light source module is, however, often challenging as the conversion efficiency of the wavelength converting element is influenced by operating conditions, mostly important being the driving current and ambient temperature.

The light source module may have a separate beam of blue light that is additional to the beam of yellow-green light emitted from the wavelength converting material. The combining of light from the two beams allows for tuning of the color point of the white light emitted from the light source module. Although this approach is universal, it introduces extra complexity in the architecture of light source module and makes the optical design more complex.

SUMMARY OF THE INVENTION

It is an object of the present invention to overcome at least some of the above problems, and to provide improved control of the color point of emitted light.

According to a one aspect of the invention, this and other objects are achieved by providing a color point variable light emitting apparatus. The color point variable light emitting apparatus comprises a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength, a light source having a controllable optical element, the light source is arranged to, with light of a first wavelength, illuminate both a portion of the wavelength converting element and a portion of the non-wavelength converting element, and a controller arranged to control the controllable optical element. The controllable optical element is arranged to change the spatial extension of the portion of the wavelength converting element and of the portion of the non-wavelength converting element illuminated by the light source.

An advantage is that the color point, i.e. the spectral composition, of the light emitted from the color point variable light emitting apparatus may be tuned efficiently. In other words, the color point of the emitted light may be set to a desired value by adjusting the controllable optical element such that the amount of light that illuminates the respective portions of the wavelength converting element and the non-wavelength converting element is changed, or varied. A simple, compact and cost effective arrangement for tuning the color point of emitted light is thereby achieved.

The efficiency of the wavelength converting element to convert light may for example depend on its temperature such that the power of light emitted from the wavelength converting member may change as a result of a temperature change. This may affect the color point of the color point variable light emitting apparatus. A change in the ratio of the portion of the wavelength converting element and the portion of the non-wavelength converting element being illuminated may, however, restore the spectral composition of the light emitted from the color point variable light emitting apparatus such that a desired color point of the emitted light may be maintained.

The wording optical element should be understood as an element which acts upon light such that a property of the light is changed. The optical element may for example change the direction of light and/or the propagation path of light. The optical element may further influence the spatial extension of the light. The optical element may for example comprise a lens, a prism, a grating, a mirror, a diaphragm, an annular and/or a slit.

The wording wavelength converting element should be understood as any element that converts light of a first wavelength, or first wavelength range, to light of a second wavelength, or second wavelength range. The wavelength conversion may be due to luminescence, fluorescence, and/or phosphorescence providing generation of a Stokes shift in the wavelength of the converted emitted light relative to the wavelength of the illuminating light.

The wording non-wavelength converting element should be understood as any element that scatters, refracts, diffracts and/or reflects light of a first wavelength such that the light of the first wavelength is redirected without a shift, or change, in wavelength or wavelength range.

The controllable optical element may be arranged to vary the angular distribution of light of the first wavelength illuminating both a portion of the wavelength converting element and a portion of the non-wavelength converting element. A compact solution for changing the relative contribution of light of the first wavelength and the second wavelength is thereby obtained without the need of additional optical elements. Efficient tuning of the color point of the light emitted by the color point variable light emitting apparatus is further obtained.

The member may be a single unit built up by the wavelength converting element and the non-wavelength converting element. A simplified assembly and alignment of the color point variable light emitting apparatus is thereby provided.

The non-wavelength converting element may comprise a scattering element arranged to, when illuminated by light of the first wavelength, scatter light of the first wavelength. The scattering of light of the first wavelength allows for efficient redistribution of light such that color-over-angle variations of the emitted light from the color point variable light emitting apparatus may be reduced. Hence, a spatially more uniform color point of the light emitted from the color point variable light emitting apparatus is achieved.

The scattering element may be arranged to scatter light of the first wavelength with a Lambertian light distribution. The scattering element may thereby provide light of the first wavelength exiting the non-wavelength converting material with an angular distribution being similar to the angular distribution of the light of the second wavelength emitted from the wavelength converting element. Color-over-angle variations of the emitted light from the color point variable light emitting apparatus may thereby be reduced. Hence, emission of light having a spatially more uniform spectral distribution may be obtained.

The non-wavelength converting element may comprise a refractive and/or diffractive element arranged to, when illuminated by light of the first wavelength, refract and/or diffract the light of the first wavelength. Light of the first wavelength may thereby be efficiently redirected in space.

The non-wavelength converting element may comprise a reflecting element, arranged to, when illuminated by light of the first wavelength, reflect the light of the first wavelength. Light of the first wavelength may thereby be efficiently redirected in space.

The angular direction and the distribution of light of the first wavelength leaving the non-wavelength converting element may thereby, by refraction, diffraction and/or reflection, be set to coincide with light of the second wavelength being emitted from the wavelength converting element. An improved uniformity of the light emitted from the color point variable light emitting apparatus may thereby be obtained.

The wavelength converting element may comprise a doped portion of a material and the non-wavelength converting element comprises an undoped portion of the material. Simplified manufacturing of the color point variable light emitting apparatus may be obtained by using the same material when providing the non-wavelength converting element and the wavelength converting element. The doping of the material should be understood to facilitate light conversion in the wavelength converting element such that light of the first wavelength is converted into light of the second wavelength. By doping a desired portion of the material provides wavelength conversion of light.

The wavelength converting element and/or non-wavelength converting element may comprise yttrium aluminum garnet, YAG.

The wavelength converting element may comprise yttrium aluminum garnet, YAG, or lutetium aluminum garnet, LuAG, doped with Ce.

The scattering element may comprise a material chosen from the group of materials comprising translucent polycrystalline alumina ceramics, PCA, titanium oxide, $TiO_2$, zirconium oxide, $ZrO_2$, hafnium oxide, $HfO_2$, zinc oxide, ZnO, aluminum oxide, $Al_2O_3$, tantalum oxide, $Ta_2O_5$, niobiumoxide, $Nb_2O_5$, yttrium oxide, $Y_2O_3$, yttrium aluminum garnet, YAG $Y_3Al_5O_{12}$, barium sulphate, $BaSO_4$, or comprises air inclusions or a surface structure, or combinations thereof.

The reflecting element may comprise a material chosen from the group of materials comprising silver, aluminum, boron nitride, microcellular formed polyethylene terephthalate, MCPET, translucent polycrystalline alumina ceramics, PCA, titanium oxide, $TiO_2$, or combinations thereof.

The reflecting element may further comprise a binder material such as ceramics, YAG, sapphire, glass, or silicone resin comprising a scattering element.

The reflecting element may comprise a binder material comprising a scattering element.

The light source may comprise a laser diode and/or a light emitting diode, LED.

According to a second aspect of the invention a method for varying color point of light is provided. The method comprising providing a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength, illuminating both a portion of the wavelength converting element and a portion of the non-wavelength converting element of the member with light of a first wavelength from a light source having a controllable optical element, controlling with a controller the controllable optical element. The controllable optical element is controlled to change the spatial extension of the portion of the wavelength converting element and of the portion of the non-wavelength converting element illuminated by the light source such that the color point of light emitted and/or redirected by the member is changed.

The function and benefits of such a method are described above in relation to the color point variable light emitting apparatus. The above mentioned features, when applicable, apply to this second aspect as well. In order to avoid undue repetition, reference is made to the above.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
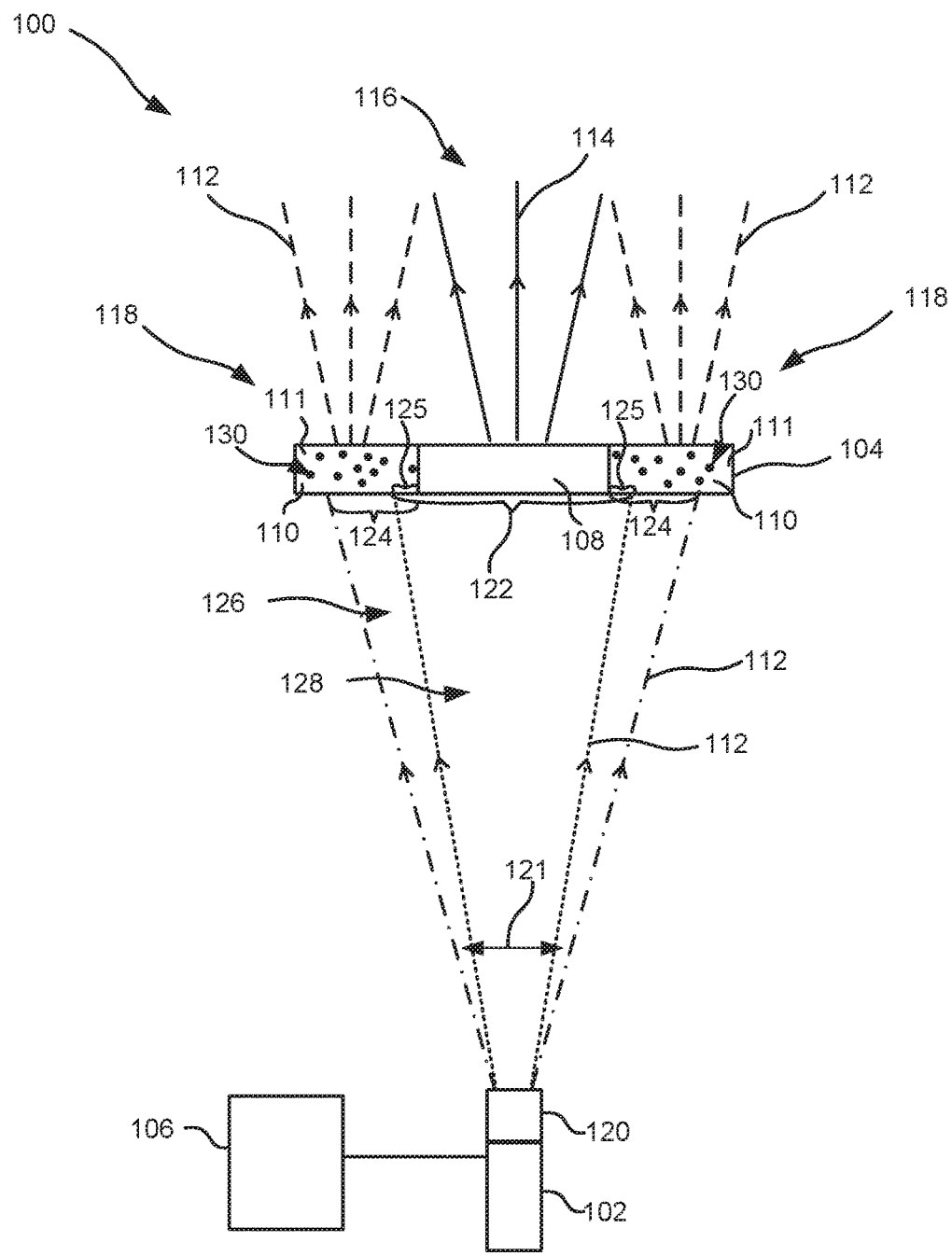
FIG. 1 illustrates a cross-sectional side view of a color point variable light emitting apparatus for emitting light in a transmission mode.

FIG. 1 illustrates a cross-sectional side view of a color point variable light emitting apparatus 100 for emitting light in a transmission mode. The color point variable light emitting apparatus 100, from here on referred to as the light emitting apparatus 100, comprises a light source 102, a member 104, and a controller 106.

The light source 102 may comprise a laser diode and/or a light emitting diode, LED, providing efficient illumination. The light emitted from the light source 102 may be monochromatic and/or collimated.

The member 104 is in this case a single unit built up by a wavelength converting element 108 and a non-wavelength converting element 110.

The wavelength converting element 108 is arranged to convert light of a first wavelength 112 (or first wavelength range), into light of a second wavelength 114 (or second wavelength range) and emit 116 the light of the second wavelength 114. The non-wavelength converting element 110 is arranged to redirect 118 light of the first wavelength 112. Hence, light of the first wavelength 112 and the second wavelength 114 are emitted from the light emitting apparatus 100.

The light source 102 has a controllable optical element 120. The light source 102 is shown to illuminate both a portion 122 of the wavelength converting element 108 and a portion 124 of the non-wavelength converting element 110 with light of a first wavelength 112, see the angular distribution indicated by the dash-dotted illumination cone 126 in FIG. 1. The ratio of the light of the first wavelength 112 and the second wavelength 114 determines the color point of the light emitted from the light emitting apparatus 100. In other words, the spectral distribution of the light emitted from the light emitting apparatus 100 may be set to a desired value by tailoring the size of the respective portions 122 and 124 that are illuminated. The larger the portion 122, 124 the more light of the corresponding wavelength is emitted by the light emitting apparatus 100.

The controller 106 is arranged to control the controllable optical element 120 such that a ratio of the portion 122 of the wavelength converting element 108 and the portion 124 of the non-wavelength converting element 110 illuminated by the light source 102 is changed. The controllable optical element 120 is further arranged to vary 121 the angular distribution of light of the first wavelength 112 illuminating both the portion 122 of the wavelength converting element 108 and the portion 124 of the non-wavelength converting element 110.

To this end, the (dotted) illumination cone 128 in FIG. 1 exemplifies a situation where the portion 125 of the non-wavelength converting element 110 is reduced in size compared to the situation when the portion 124 is illuminated by the dash-dotted illumination cone 126. Light of the second wavelength 114 is a larger portion of the total light emitted by the light emitting apparatus 100 as the illumination angle is changed from the illumination cone 126 to the (smaller) illumination cone 128. In other words, the illumination cone 128 reduces the amount of light of the first wavelength 112 that may be redirected by the non-wavelength converting element 110.

The light emitting apparatus 100 thereby allows for emission of light of which the color point may be changed by changing the illumination cone. A change in color point resulting from, for instance, a change in ambient temperature or a change in the temperature of the member 104 due to heating during use may thereby efficiently be counteracted by changing the ratio of the portion 122 of the wavelength converting 108, and the portion 124, 125 of non-wavelength converting elements that are illuminated. The temperature may, for example, be measured by a temperature sensor and be an input signal for the controller 106.

The light of the first wavelength 112 may have a wavelength in the blue range of the optical spectrum providing blue light and the light of the second wavelength 114 may have a wavelength in the yellow-green range of the optical spectrum providing yellow-green light. The blue and the yellow-green light from the light emitting apparatus 100 may further produce white light when combined. Hence, the light emitting apparatus 100 may provide white light with a desired spectral distribution by tailoring the amount of blue and yellow-green light. The white light emitted by the light emitting apparatus 100 may for example be made to appear whiter, by increasing the area of the portion 124 that is illuminated, i.e. the light becomes less yellow in color by increasing the amount of blue light of the first wavelength 112 being redirected by the non-wavelength converting element 110.

More generally, the color point of the white light may be set to a predetermined value by adjusting the ratio of light of the first 112 and the second 114 wavelength. A yellow-green to blue spectral contribution of about 3:1, for example, may provide a white light having a color point of about 3000 K. Hence, for providing such a color point only a relatively small portion 124 of the non-wavelength converting element 110 needs to be illuminated compared to the portion 122 of the wavelength converting element 108. A compact tuneable light emitting apparatus 100 may thereby be provided emitting light with a desired color point.

The amount of light of the second wavelength 114 may be increased by increasing the thickness of the wavelength converting element 108, i.e. a larger thickness may increase the wavelength conversion efficiency of the wavelength converting element 108.

It should be noted that the controllable optical element 120 may be integrated into the light source 102 or be external to the light source 102.

The person skilled in the art realizes that the controllable optical element 120 may be arranged to vary 121 the distribution of light of the first wavelength 112 illuminating both the portion 122 of the wavelength converting element 108 and the portion 124 of the non-wavelength converting element 110 not only by varying 121 the angular distribution of light. The distribution of light illuminating the respective portions 122 and 124 may for example be varied by changing the spatial extension of the light on the portions 122, 224 by utilizing a diaphragm, also referred to as an iris diaphragm. In other words, the beam diameter of the beam of light which is illuminating the member may be changed by altering the size of the aperture of the diaphragm. Alternatively, an illumination spot, obtained as the light of the first wavelength reaches the member may be made to change its position on the member by changing the controllable optical element. The distribution of light illuminating on the respective portions 122 and 124 may thereby be changed by a movement of the light source relative to the member, i.e. the illumination spot may be swept across the member.

The size of the illumination spot may further be changed by changing the focus of light or by changing the numerical aperture of the controllable optical element.

A combination of varying the focus and shift the position of the illumination spot on the member may further be used to balancing of the light exposing the respective portions of the wavelength converting element and the non-wavelength converting element.

As a result of the varying of the distribution of light the ratio of light of the first wavelength illuminating a portion of the wavelength converting element and the portion of the non-wavelength converting element may be tuned.

The controller 106 may form a single unit with the light source 102.

The wavelength converting element 108 may comprise yttrium aluminum garnet, YAG doped with Ce or Lu. YAG doped with Ce provides light emission in the yellow-green part of the visible optical spectrum and has relatively high conversion efficiency when illuminated with blue light. The skilled person in the art realizes that other materials and/or dopants may be used for wavelength conversion of a first wavelength to a second wavelength.

The non-wavelength converting element 110 may comprise a refractive element such that light of the first wavelength 112 which illuminates a portion 124, 125 of the non-wavelength converting element 110 is refracted. In FIG. 1 the non-wavelength converting material is the refractive element 111. The non-wavelength converting element 110 thereby refract such that the light of the first wavelength 112 is redirected 118.

The dimensions, geometry and/or the refractive index of the non-wavelength converting element 110 may determine the angular directions and/or the spatial locations at which light of the first wavelength 112 is emitted from the light emitting apparatus 100. Hence, the choice of material of the non-wavelength converting element 110 as well as the dimensions such as its thickness and geometry, such that facet inclinations, may set the spatial distribution of the light of the first wavelength 112 that is emitted from the light emitting apparatus 100.

The non-wavelength converting element 110 may comprise yttrium aluminum garnet, YAG having a refractive index larger than air, e.g. at least 1.8 in the visible spectrum, such that light of the first wavelength 112 may be efficiently refracted when transmitted through the YAG material.

The non-wavelength converting element 110 may comprise a scattering element 130. In FIG. 1, a plurality of scattering elements 130 are shown. The scattering elements 130 are arranged to scatter light of the first wavelength 112 when light of the first wavelength 112 is incident on the scattering elements 130.

The scattering elements 130 may have a refractive index that is different from that of the non-wavelength converting material 110 surrounding the scattering elements 130. The difference in refractive index allows for efficient scattering of light and therefore light of the first wavelength 110 may be redistributed efficiently by the scattering elements 130. The scattering elements 130 in FIG. 1 are randomly distributed within the non-wavelength converting element 110. The skilled person in the art realizes that other distributions of the scattering elements 130 within the non-wavelength converting element 110 are possible and that the location of the scattering elements 130 may influence the amount of light that is scattered and the angles at which the light is scattered.

In general, the distribution of scattering elements may be varied in order to mimic and/or match the angular emission distribution of light emitted from the wavelength converting element.

The size and shape of the scattering elements 130 may further influence the scattering of light. The scattering of a sphere may for example be described by Mie-theory and the skilled person in the art understands that for a given wavelength of light parameters such as the refractive index of the scattering element 130 and of its surrounding, as well as the size of the scattering element may influence the scattering efficiency of the scattering element 130. By proper selection of these parameters the scattering of a given wavelength may be improved.

The scattering element 130 may for example comprise a material chosen from the group of materials comprising translucent polycrystalline alumina ceramics, PCA, titanium oxide, $TiO_2$, zirconium oxide, $ZrO_2$, hafnium oxide, $HfO_2$, zinc oxide, ZnO, aluminum oxide, $Al_2O_3$, tantalum oxide, $Ta_2O_5$, niobiumoxide, $Nb_2O_5$, yttrium oxide, $Y_2O_3$, yttrium aluminum garnet, YAG $Y_3Al_5O_{12}$, barium sulphate, $BaSO_4$, or comprises air inclusions or a surface structure, or combinations thereof.

The skilled person in the art realizes that in the case of, for example, PCA the scattering occurs in the bulk of ceramics, i.e. on the refractive index variations between the polycrystalline grain boundaries. In that sense the scattering element 130 and the non-wavelength converting member 110 constitute one body.

The scattering element may comprise air inclusions.

The scattering element may comprise a surface structure. The surface structure may be a roughened surface of the non-wavelength converting element such that light is scattered and/or refracted at the surface of the non-wavelength converting material. The scattering element may further comprise surface patterns of for example half-sphere structures or other microstructures providing efficient redistribution of light by scattering.

The wavelength converting element 108 may comprise Lumiramic™, i.e. a polycrystalline ceramic plate of Ce (III) doped yttrium gadolinium aluminum garnet (Y,GdAG:Ce) providing efficient wavelength conversion of light.

The wavelength converting element 108 may comprise yttrium aluminum garnet, YAG, or lutetium aluminum garnet, LuAG, doped with Ce.

Figure 2:
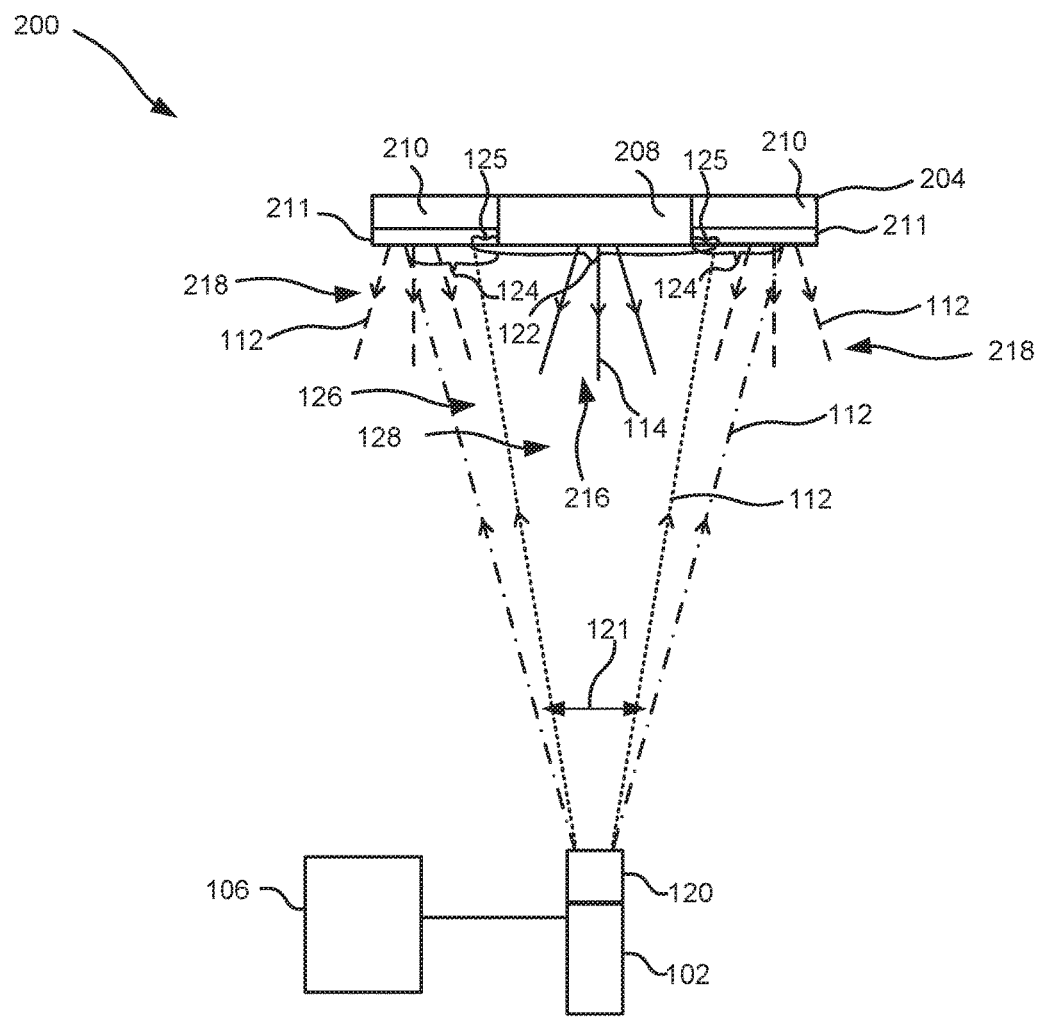
FIG. 2 illustrates a cross-sectional side view of another color point variable light emitting apparatus in a reflection mode.

FIG. 2 illustrates a cross-sectional side view of a color point variable light emitting apparatus 200 for emitting light in a reflection mode. The color point variable light emitting apparatus 200, from here on referred to as the light emitting apparatus 200, comprises a light source 102, a member 204, and a controller 106, as also described in relation to FIG. 1.

The member 204 is in this case a single unit built up by a wavelength converting element 208 and a non-wavelength converting element 210. The wavelength converting element 208 is arranged to convert light of a first wavelength 112 into light of a second wavelength 114 and emit 216 the light of the second wavelength 114. The non-wavelength converting element 210 is arranged to redirect 218 light of the first wavelength 112. Hence, light of the first wavelength 112 and the second wavelength 114 are emitted from the light emitting apparatus 200.

As discussed above, the light source 102 illuminates both a portion 122 of the wavelength converting element 208 and a portion 124 of the non-wavelength converting element 210 with light of a first wavelength 112, see the angular distribution indicated by the illumination cones 126 and 128 in FIG. 2. Other features and benefits of the light source 102 will for brevity not be disclosed again and reference is made to FIG. 1.

The ratio of the light of the first wavelength 112 and the second wavelength 114 determines the color point of the light emitted from the light emitting apparatus 200. In other words, the spectral distribution of the light emitted from the light emitting apparatus 200 may be set to a desired value by tailoring the size of the respective portions 122 and 124 that are illuminated. This may be achieved by varying 121 the angular distribution of light of the first wavelength 112 illuminating both the portion 122 of the wavelength converting element 108 and the portion 124 of the non-wavelength converting element 110.

To provide efficient redistribution of light of the first wavelength 112 the non-wavelength converting element 210 comprises a reflecting element 211. The reflecting element 211 is arranged to, when illuminated by light of the first wavelength 112, reflect the light of the first wavelength 112 such that it is redirected 218. The light emitting apparatus 200 may thereby emit light of the first 112 and the second 114 wavelength.

It should be noted that the element 211 is in FIG. 2 illustrated as a surface element, but the skilled person in the art realizes that the reflection may also occur in the bulk of the non-wavelength converting material.

The controller 106 is arranged to achieve tuning of the color point of the light emitting apparatus 200. This is achieved by controlling the controllable optical element 120 such that a ratio of the portion 122 of the wavelength converting element and the portion 124 of the non-wavelength converting element illuminated by the light source 102 is changed. The dashed illumination cone 128 in FIG. 2 also exemplifies a situation where the portion 125 of the non-wavelength converting element 210 is reduced in size compared to the portion 124 illuminated by the dash-dotted illumination cone 126.

Light of the first wavelength 112 is thereby to a smaller extent reflected by the reflecting element 211 of the light emitting apparatus 200. The light emitting apparatus 200 thereby allows for emission of light of which the color point may be changed. A change in color point resulting from, for instance, a change in ambient temperature or a change in the temperature of the member due to heating during use may thereby efficiently be counteracted by changing the ratio of the portions of the wavelength converting element 208 and the non-wavelength converting element 210 that are illuminated. For example a temperature sensor may send an input signal to the controller 106.

The reflecting element 211 may comprise a substantially smooth reflecting surface providing specular reflection of light. Light of the first wavelength 112 having the same angle of incidence that is incident on the reflecting element 211 may thereby be redirected into a single outgoing direction which may be described by the law of reflection. The reflecting surface may for example comprise a metal such as aluminum or silver.

The reflecting element 211 may comprise a roughened or patterned reflecting surface providing diffuse reflection of light. Light of the first wavelength 112 having the same angle of incidence that is incident on the reflecting element 211 may thereby be redirected into different directions as individual rays of light of the first wavelength 112 incident on the roughened or patterned reflecting surface may be reflected at portions of the surface having different orientations, i.e. different surface normals. The individual rays may thereby be reflected off the reflecting surface according to the law of reflection but scatter in different directions. Hence, light of the first wavelength 112 may be diffusively scattered and/or redistributed by the reflecting element 211.

In addition, the light can be redistributed by applying appropriate surface patterning or structuring.

The reflecting element 211 may comprise a metal such as silver or aluminum providing efficient reflection of light. Silver or aluminum may provide specular reflection.

The non-wavelength converting material 210 may form the reflecting element 211.

The reflecting element 211 may comprise microcellular formed polyethylene terephthalate, MCPET, translucent polycrystalline alumina ceramics, PCA, titanium oxide, $TiO_2$, or combinations thereof. Such a reflecting element 211 may be arranged at the surface of or inside a non-wavelength converting element 210, comprising for instance YAG, sapphire, silicone or glass. Reflection of light of the first wavelength 112 may thereby be achieved when the light of the first wavelength 112 is incident on such a reflecting element 211.

The reflecting element 211 may comprise boron nitride providing reflection of light of the first wavelength 112 and improved thermal management.

The reflective element 211 and/or the scattering element 130 may be arranged to scatter light of the first wavelength with 110 a Lambertian light distribution. This is advantageous as this mitigates color-over-angle variations in the color point of the light emitted by the light emitting apparatus 100 or 200. In other words, a distribution with increased angular uniformity, which translates to an increased spatial uniformity in the far-field, may be achieved by the light emitting apparatus 100 and 200.

The wavelength converting member may comprise a scattering element, the features and benefits of the scattering element have been described above. Efficient redirection of light reflected and/or emitted by the element may thereby be obtained.

An additional reflecting element may further be arranged at the back side, i.e. the side facing away from the light source, of the wavelength converting element 208. Light emitted by the wavelength converting element in a direction being opposite to the direction of the redirected light of the first wavelength may be reflected and re-directed. An increased light output within a given angular distribution may thereby be obtained. Such an arrangement may thereby increase the amount of light emitted by the color point variable light emitting apparatus.

In the above discussion the member has been described to comprise one wavelength converting element converting light of a first wavelength to a second wavelength. The skilled person in the art realizes that the wavelength converting element may convert light from a first wavelength to a plurality of wavelengths, e.g. a second wavelength and a third wavelength.

The member may further comprise a plurality of wavelength converting elements, wherein the wavelength converting members may convert light of a first wavelength into light of different wavelengths, e.g. two wavelength converting elements converting light into a second and third wavelength, respectively. The color point of the light emitted by the color point variable light emitting apparatus may thereby be varied by changing the ratios of the portions of the respective two wavelength converting elements, and the portion of the non-wavelength converting element, that are illuminated by the light source.

Figure 3:
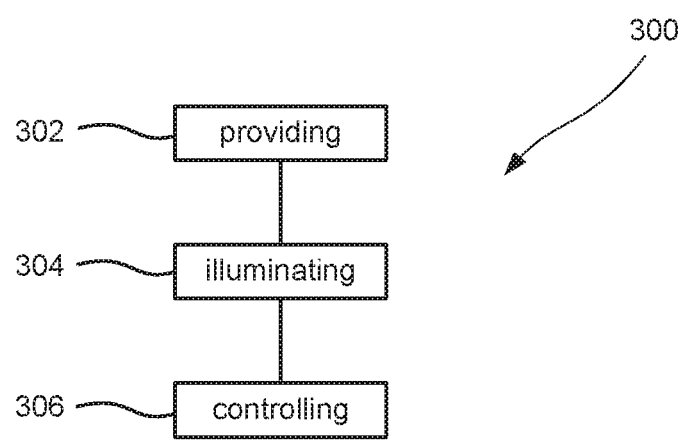
FIG. 3 illustrates a method for varying color point of light.

FIG. 3 illustrates method for varying color point of light. The method 300 comprises providing 302 a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength, illuminating 304 both a portion of the wavelength converting element and a portion of the non-wavelength converting element of the member with light of a first wavelength from a light source having a controllable optical element, controlling 306 with a controller the controllable optical element such that a ratio of the portion of the wavelength converting element and the portion of the non-wavelength converting element illuminated by the light source is changed such that the color point of light emitted and/or redirected by the member is changed.

The function and benefits of using the method 300 for varying color point of light are described above in relation to the light emitting apparatus 100 or 200. The above mentioned features, when applicable, apply to the method 300 as well. In order to avoid undue repetition, reference is made to the above.

The person skilled in the art realizes that the present invention by no means is limited to the preferred embodiments described above. On the contrary, many modifications and variations are possible within the scope of the appended claims.

For example, the wavelength converting element and the non-wavelength converting element may constitute separated parts of the member.

The non-wavelength converting element may comprise optical structures, e.g. micro-scale structures arranged to refract the light to achieve a desired distribution of light.

The non-wavelength converting element may also comprise diffractive structures arranged to diffract the light to achieve a desired distribution of light.

The wavelength converting element may comprise a dichroic mirror arranged to transmit light of the first wavelength and reflect light of the second wavelength. The dichroic mirror may comprise alternating layers of optical coatings with different refractive indexes to form an interference filter. The dichroic mirror may also be referred to as a dichroic filter, thin-film filter, or interference filter. Hence, the dichroic reflector may be understood as is a color filter arranged to selectively pass light of a small range of colors while reflecting other colors.

The dichroic mirror may, in a transmission mode, be arranged on a side surface of the wavelength converting element that is facing the light source. Light of the first wavelength emitted from the light source may thereby pass the dichroic mirror and enter into the wavelength converting element. Converted light of the second wavelength that is emitted in a direction towards the dichroic mirror may thereby be reflected by the dichroic mirror. The amount of light of the second wavelength that is emitted in a forward direction, i.e. as seen from the light source is thereby increased. The light output from the light emitting apparatus may thereby be increased.

The wavelength converting element may comprise a translucent material. The wording translucent is to be understood as permitting the passage of light. Hence, translucent is to be understood as "permitting the passage of light" and a translucent material may either be clear, i.e. transparent, or transmitting and diffusing light so that objects beyond cannot be seen clearly. Transparent is to be understood as "able to be seen through".

The controller or controlling function may have preset or pre-programmed control settings and/or may be based on input signals, such as for example measured via a light sensor, temperature sensor, etc.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A color point variable light emitting apparatus comprising:
a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength;
a light source having a controllable optical element, the light source is arranged to, with light of a first wavelength, illuminate both a portion of the wavelength converting element and a portion of the non-wavelength converting element; and
a controller arranged to control the controllable optical element,
wherein the controllable optical element is arranged to change the spatial extension of the portion of the wavelength converting element and of the portion of the non-wavelength converting element illuminated by the light source by varying the angular distribution of light of the first wavelength illuminating both a portion of the wavelength converting element and a portion of the non-wavelength converting element.

2. The light emitting apparatus according to claim 1, wherein the member is a single unit built up by the wavelength converting element and the non-wavelength converting element.

3. The light emitting apparatus according to claim 1, wherein the non-wavelength converting element comprises a scattering element arranged to, when illuminated by light of the first wavelength, scatter light of the first wavelength.

4. The light emitting apparatus according to claim 3, wherein the scattering element is arranged to scatter light of the first wavelength with a Lambertian light distribution.

5. The light emitting apparatus according to claim 3, wherein the scattering element comprises a material chosen from the group of materials comprising translucent polycrystalline alumina ceramics, PCA, titanium oxide, $TiO_2$, zirconium oxide, $ZrO_2$, hafnium oxide, $HfO_2$, zinc oxide, ZnO, aluminum oxide, $Al_2O_3$, tantalum oxide, $Ta_2O_5$, niobium oxide, $Nb_2O_5$, yttrium oxide, $Y_2O_3$, yttrium aluminum garnet, YAG $Y_3Al_5O_{12}$, barium sulphate, $BaSO_4$, or comprises air inclusions or a surface structure, or combinations thereof.

6. The light emitting apparatus according to claim 1, wherein the non-wavelength converting element comprises one of a refractive and diffractive element arranged to, when illuminated by light of the first wavelength, refract the light of the first wavelength.

7. The light emitting apparatus according to claim 1, wherein the non-wavelength converting element comprises a reflecting element, arranged to, when illuminated by light of the first wavelength, reflect the light of the first wavelength.

8. The light emitting apparatus according to claim 7, wherein the reflecting element comprises a material chosen from the group of materials comprising silver, aluminum, boron nitride, microcellular formed polyethylene terephthalate, MCPET, translucent polycrystalline alumina ceramics, PCA, titanium oxide, $TiO_2$, or combinations thereof.

9. The light emitting apparatus according to claim 1, wherein the wavelength converting element comprises a doped portion of a material and the non-wavelength converting element comprises an undoped portion of the material.

10. The light emitting apparatus according to claim 1, wherein the wavelength converting element comprises yttrium aluminum garnet, YAG, or lutetium aluminum garnet, LuAG, doped with Ce.

11. A color point variable light emitting apparatus comprising:
   a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength;
   a light source having a controllable optical element, the light source is arranged to, with light of a first wavelength, illuminate both a portion of the wavelength converting element and a portion of the non-wavelength converting element; and
   a controller arranged to control the controllable optical element,
   wherein the controllable optical element is arranged to change the spatial extension of the portion of the wavelength converting element and of the portion of the non-wavelength converting element illuminated by the light source, and
   wherein the controllable optical element comprises a diaphragm.

12. A color point variable light emitting apparatus comprising:
   a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength;
   a light source having a controllable optical element, the light source is arranged to, with light of a first wavelength, illuminate both a portion of the wavelength converting element and a portion of the non-wavelength converting element; and
   a controller arranged to control the controllable optical element,
   wherein the controllable optical element is arranged to change the spatial extension of the portion of the wavelength converting element and of the portion of the non-wavelength converting element illuminated by the light source by changing an illumination spot at the wavelength converting element and at the non-wavelength converting element.

13. A color point variable light emitting apparatus comprising:
   a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength;
   a light source having a controllable optical element, the light source is arranged to, with light of a first wavelength, illuminate both a portion of the wavelength converting element and a portion of the non-wavelength converting element;
   a controller arranged to control the controllable optical element,
   wherein the controllable optical element is arranged to change the spatial extension of the portion of the wavelength converting element and of the portion of the non-wavelength converting element illuminated by the light source by changing a focus of the light source.

14. A method for varying color point of light, the method comprising:
   providing a member comprising a wavelength converting element and a non-wavelength converting element, the wavelength converting element is arranged to convert light of a first wavelength into light of a second wavelength and emit the light of the second wavelength, and the non-wavelength converting element is arranged to redirect light of the first wavelength;
   illuminating both a portion of the wavelength converting element and a portion of the non-wavelength converting element of the member with light of a first wavelength from a light source having a controllable optical element; and
   controlling with a controller the controllable optical element,
   wherein the controllable optical element is controlled to change the spatial extension of the portion of the wavelength converting element and of the portion of the non-wavelength converting element illuminated by the light source by varying the angular distribution of light of the first wavelength illuminating both a portion of the wavelength converting element and a portion of the non-wavelength converting element such that the color point of light emitted or redirected by the member is changed.

* * * * *